United States Patent
Lin et al.

(10) Patent No.: US 11,328,992 B2
(45) Date of Patent: May 10, 2022

(54) INTEGRATED CIRCUIT COMPONENTS WITH DUMMY STRUCTURES

(71) Applicant: Intel Corporation, Santa Clara, CA (US)

(72) Inventors: Kevin L. Lin, Beaverton, OR (US); Nicholas James Harold McKubre, Portland, OR (US); Richard Farrington Vreeland, Portland, OR (US); Sansaptak Dasgupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 39 days.

(21) Appl. No.: 16/642,851

(22) PCT Filed: Sep. 27, 2017

(86) PCT No.: PCT/US2017/053594
§ 371 (c)(1),
(2) Date: Feb. 27, 2020

(87) PCT Pub. No.: WO2019/066792
PCT Pub. Date: Apr. 4, 2019

(65) Prior Publication Data
US 2020/0350246 A1 Nov. 5, 2020

(51) Int. Cl.
*H01L 23/522* (2006.01)
*H01L 23/532* (2006.01)
*H01L 21/768* (2006.01)

(52) U.S. Cl.
CPC ...... *H01L 23/5227* (2013.01); *H01L 23/5226* (2013.01); *H01L 23/5329* (2013.01);
(Continued)

(58) Field of Classification Search
CPC ............. H01L 23/5227; H01L 23/5226; H01L 23/53209; H01L 23/5329; H01L 21/76877;
(Continued)

(56) References Cited

U.S. PATENT DOCUMENTS 8,234,595 B2    7/2012 Kim et al.
2004/0121577 A1 *  6/2004 Yu ................... H01L 21/76852
                                                   438/622
(Continued)

FOREIGN PATENT DOCUMENTS

KR    20100005388 A    1/2010
WO    2019066792 A1    4/2019

OTHER PUBLICATIONS

Woytowitz, Peter, et al., "Mechanical properties of Si—C—O—H low-k dielectrics prepared by plasma enhanced chemical vapor deposition," ASMC (Advanced Semiconductor Manufacturing Conference) Proceedings. 1-6. 10.1109/ASMC.2011.5898181, May 1, 2011.
(Continued)

*Primary Examiner* — Patricia D Valenzuela
(74) *Attorney, Agent, or Firm* — Patent Capital Group

(57) ABSTRACT

Disclosed herein are integrated circuit (IC) components with dummy structures, as well as related methods and devices. For example, in some embodiments, an IC component may include a dummy structure in a metallization stack. The dummy structure may include a dummy material having a higher Young's modulus than an interlayer dielectric of the metallization stack.

17 Claims, 8 Drawing Sheets

(52) U.S. Cl.
CPC .............. *H01L 23/53209* (2013.01); *H01L 21/76852* (2013.01); *H01L 23/5222* (2013.01)

(58) Field of Classification Search
CPC .............. H01L 23/522; H01L 21/7684; H01L 23/5222; H01L 21/76852
See application file for complete search history.

(56) References Cited

U.S. PATENT DOCUMENTS

| | | | | |
|---|---|---|---|---|
| 2004/0253810 | A1* | 12/2004 | Wang | H01L 21/32115 438/633 |
| 2005/0095837 | A1 | 5/2005 | Feng et al. | |
| 2007/0007618 | A1* | 1/2007 | Hasunuma | H01L 23/53238 257/508 |
| 2007/0170591 | A1 | 7/2007 | Yamanoue et al. | |
| 2008/0272495 | A1* | 11/2008 | Nakashiba | H01L 23/522 257/773 |
| 2012/0187572 | A1* | 7/2012 | Lin | H01L 23/5227 257/774 |
| 2013/0147023 | A1* | 6/2013 | Lin | H01L 25/16 257/659 |
| 2013/0256872 | A1* | 10/2013 | Su | H01L 23/522 257/737 |
| 2015/0002213 | A1* | 1/2015 | Zhang | H01L 23/5256 336/186 |
| 2016/0218172 | A1* | 7/2016 | Hsieh | H01L 28/90 |
| 2017/0213821 | A1 | 7/2017 | Or-Bach et al. | |

OTHER PUBLICATIONS

"Young's modulus," from Wikipedia, the free encyclopedia, Jul. 13, 2017; 9 pages.

PCT Jun. 25, 2018—International Search Report and Written Opinion of the International Searching Authority from International Application No. PCT/US2017/053594; 10 pages.

"Material: Silicon Dioxide (SiO2), film," MEMSnet.org, A MEMS Clearinghouse and information portal for the MEMS and Nanotechnology community (2017); 4 pages.

Lai, Jiun-Yu, "Chapter 5: Evolution of Copper Oxide Damascene Structures in CMP: II. Dishing and Overpolishing," from Mechanics, Mechanism, and Modeling of the Chemical Mechanical Polish Process, Thesis Submitted to the Dept. of Mechanical Engineering at Massachusetts Institute of Technology, Feb. 2001; pp. 167-202.

Hopcroft, M.A., et al."What is the Young's Modulus of Silicon?", IEEE Journal of Microelectromechanical Systems, vol. 19, Issue 2, pp. 229-238, Apr. 2010 (DOI: 10.1109/JMEMS.2009.2039697).

Accuratus Corporation, "Silicon Nitride Material Properties: Si3N4 Ceramic Properties," Accuratus Corporation (2017); 3 pages.

Accuratus Corporation, "Silicon Carbide Material Properties: Silicon Carbide, SiC Ceramic Properties," Accuratus Corporation (2017); 3 pages.

Accuratus Corporation, "Aluminum Oxide Al2O3 Material Properties: Aluminum Oxide, Al2O3 Ceramic Properties," Accuratus Corporation (2017); 5 pages.

* cited by examiner

INTEGRATED CIRCUIT COMPONENTS WITH DUMMY STRUCTURES

CROSS-REFERENCE TO RELATED APPLICATION

This application is a national stage application under 35 U.S.C. § 371 of PCT International Application Serial No. PCT/US2017/053594, filed on Sep. 27, 2017 and entitled "INTEGRATED CIRCUIT COMPONENTS WITH DUMMY STRUCTURES," which is hereby incorporated by reference herein in its entirety.

BACKGROUND

Integrated circuit (IC) manufacturing often includes polishing operations to mechanically and/or chemically planarize a surface of a component. For example, a surface of a component may be polished after the deposition of one material and before the deposition of another material.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1A:
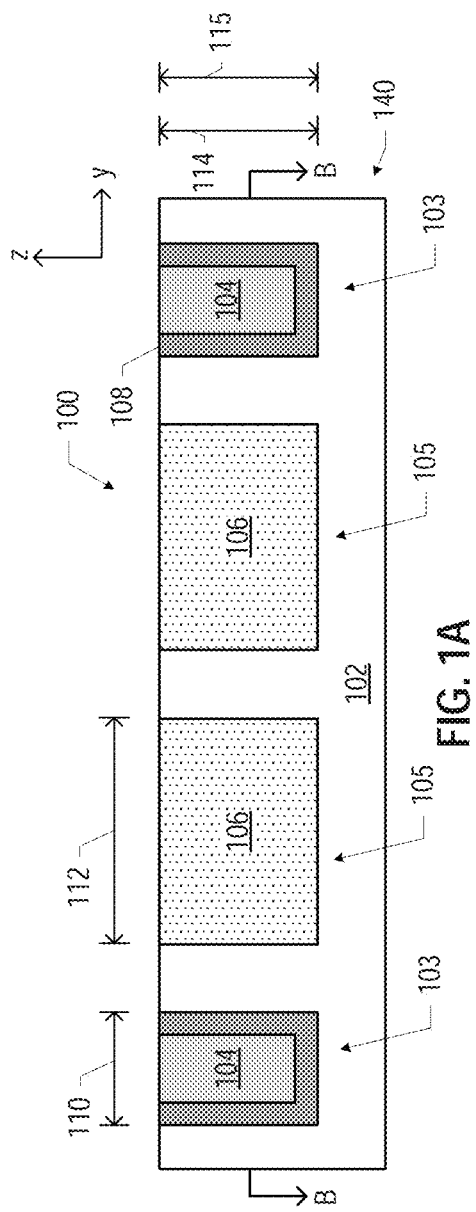
FIGS. 1A-1B are various views of a portion of an integrated circuit (IC) component including dummy structures, in accordance with various embodiments.

Disclosed herein are integrated circuit (IC) components with dummy structures, as well as related methods and devices. For example, in some embodiments, an IC component may include a dummy structure in a metallization stack. The dummy structure may include a dummy material having a higher Young's modulus than an interlayer dielectric of the metallization stack.

As noted above, chemical and/or mechanical polishing operations may be performed during the fabrication of an IC component (e.g., a die, package substrate, interposer, etc.) to achieve a substantially flat surface on which further fabrication operations may be performed. However, the rate at which material is removed from a polished surface may depend on the material composition of that surface; when a surface includes multiple different materials, the resulting polished surface may be irregular.

This effect may be particularly pronounced when a surface includes large areas of a "softer" material (e.g., as measured by the Young's modulus of the material) between areas of a "harder" material. The large areas of the softer material may be polished away at a faster rate than the areas of the harder material, causing recesses in the softer material referred to as "dishing." For example, when two conductive lines (formed of a metal, such as copper) are spaced apart by a large region of interlayer dielectric (ILD) (e.g., silicon oxide or a carbon-doped silicon oxide film), the "softer" ILD may polish faster than the "harder" metal, resulting in concave depressions in the ILD between the conductive lines. Similarly, surfaces that include large areas of "harder" metal may also be difficult to polish uniformly, sometimes resulting in deformation of the surface.

To mitigate dishing or other deformations resulting from polishing, some IC components are subject to design rules that require a minimum metal density across different sections of a surface that will be polished. Such design rules may specify a minimum and/or a maximum percentage of metal (e.g., between 10 percent copper and 80 percent copper) that must be present within different areas of the surface, limiting the range of possible sizes of ILD areas. In order to satisfy these design rules, metal dummy structures (using the same metal as the non-dummy structures, such as conductive lines and vias) may be incorporated into the IC component. These metal dummy structures are not electrically connected to other elements in the IC component but conventionally serve only to increase the local metal density and thus improve polishing performance.

However, the presence of conventional metal dummy structures may compromise electrical performance of some IC components. For example, when metal dummy structures are located in the interior of an inductor, the metal dummy structures may generate eddy currents during operation of the inductor, generating losses by heat and reducing the inductance of the inductor. Further, using metal dummy structures may increase electromagnetic interference (e.g., with the metal dummy structures acting as antennas) and/or increase the risk of inadvertent electrical shorts (e.g., when a metal dummy structure inadvertently bridges two conductive pathways along which signals, power, or reference voltages are transmitted).

Disclosed herein are dummy structures for IC components that may provide any of a number of advantages over conventional dummy structures. For example, various ones of the embodiments disclosed herein include dielectric or ferromagnetic dummy structures, which may improve the performance of inductors integrated into a metallization stack. Also disclosed herein are techniques for fabricating dummy structures without requiring an additional mask for the dummy structures. Such techniques may desirably reduce the complexity, cost, and misalignment risk of dummy fabrication, relative to conventional techniques.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 1" may be used to refer to the collection of drawings of FIGS. 1A-1B, and the phrase "FIG. 2" may be used to refer to the collection of drawings of FIGS. 2A-2I.

Figure 1B:
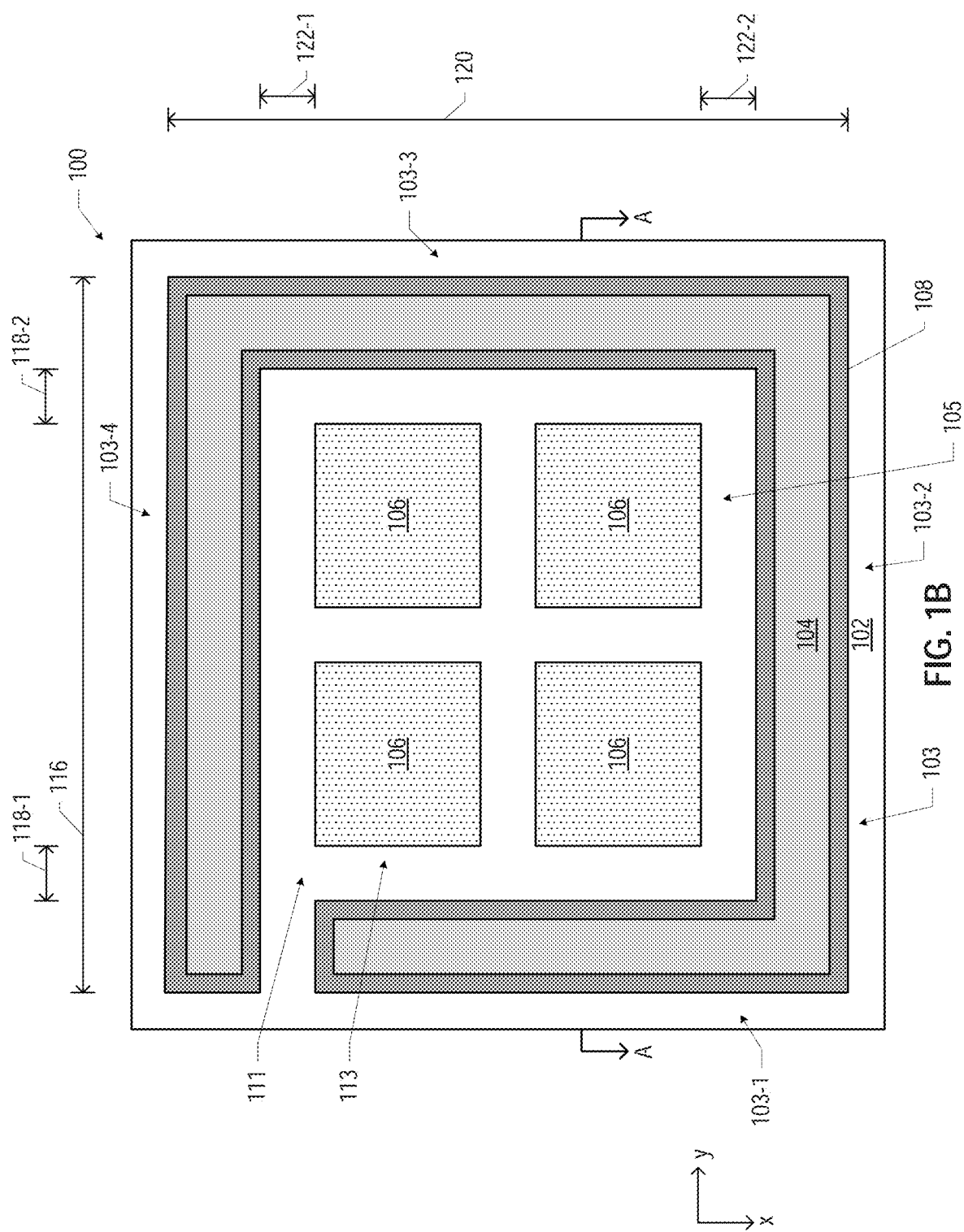

FIGS. 1A-1B are various views of a portion of an IC component 100 including dummy structures 105, in accordance with various embodiments. In particular, FIG. 1A is a side cross-sectional view of a portion of a metallization stack 140 of an IC component 100 (through the section A-A of FIG. 1B), and FIG. 1B is a top cross-sectional view of the IC component 100 (through the section B-B of FIG. 1A). The IC component 100 may be any suitable IC component, such as a die, a package substrate, an interposer, a circuit board, etc. A number of examples of such IC components 100 are discussed in further detail below.

The IC component 100 of FIG. 1 may include one or more conductive structures 103 and one or more dummy structures 105 in an ILD 102 of a metallization stack 140. The ILD 102 may include any suitable materials, such as silicon oxide or a carbon-doped silicon oxide film. In some embodiments, the conductive structures 103 may span multiple interconnect layers in the metallization stack 140 (e.g., as discussed below with reference to FIG. 3 and FIG. 7), while in other embodiments, the conductive structures 103 may be confined to a single interconnect layer in the metallization stack 140. In some embodiments, the conductive structure 103 may be included in a top interconnect layer of the metallization stack 140 (e.g., the layer of the metallization stack 140 that is farthest from the device layer, as discussed below with reference to FIG. 7).

The conductive structures 103 may include any suitable materials. For example, FIG. 1 illustrates an embodiment in which the conductive structures 103 include a liner material 108 and a conductive fill material 104. In some embodiments, the liner material 108 may include a diffusion barrier liner (to mitigate diffusion of the material of the conductive fill material 104 into the ILD 102) or an adhesion liner (to improve mechanical coupling between the conductive fill material 104 and the ILD 102). In some embodiments, the liner material 108 may include tantalum or silicon nitride, and the conductive fill material 104 may be a metal (e.g., copper). In other embodiments, the conductive structures 103 may have other compositions (e.g., multiple or no liner materials). Although FIG. 1 (and others of the accompanying drawings) illustrate the liner material 108 as having a substantially uniform thickness, this need not be the case. For example, in some embodiments, the liner material 108 may be thicker at the bottom than on the sidewalls of the ILD 102 (e.g., when the liner material 108 is deposited by physical vapor deposition (PVD)).

Figure 3:
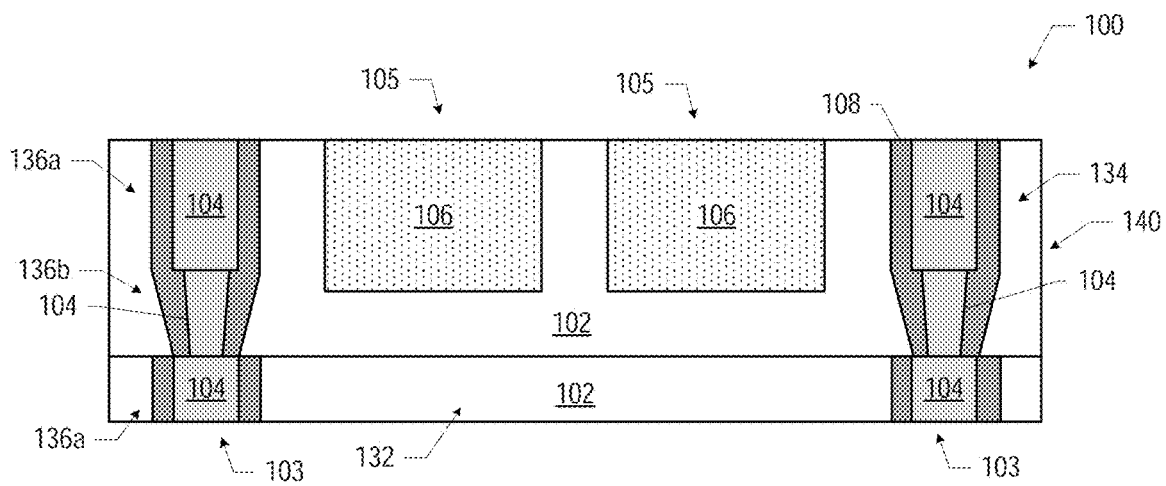
FIGS. 3 and 4 are side cross-sectional views of additional example IC components including dummy structures, in accordance with various embodiments.

In some embodiments, the conductive structures 103 may include one or more conductive lines and/or one or more conductive vias. For example, the embodiment of FIG. 1 illustrates a conductive structure including conductive lines arrange to form an inductor, as illustrated in FIG. 1B and discussed further below. The conductive structures 103 need not form an inductor; more generally, the conductive structures 103 may include any conductive lines, conductive vias, or other conductive structures (e.g., capacitor plates, electrodes, etc.). The inductor of FIG. 1 is disposed in a single interconnect layer of the metallization stack 140; FIG. 3 illustrates an embodiment in which a conductive structure 103 (e.g., an inductor) spans multiple interconnect layers of the metallization stack 140.

As noted above, in the embodiment illustrated in FIG. 1B, the conductive structure 103 takes the form of an inductor. The inductor includes four segments 103-1, 103-2, 103-3, and 103-4 that together delineate an interior 111 of the inductor. The particular shape of the inductor shown in FIG. 1B is simply illustrative, and the inductor may have a different shape (e.g., a triangle, a hexagon, an octagon, a spiral in the z-direction, etc.). Multiple dummy structures 105 are arranged in an array 113 in the interior 111 of the inductor; the particular number and arrangement of dummy structures 105 in FIG. 1B is simply illustrative, and any number and arrangement of dummy structures 105 may be included in an interior 111 of an inductor (or, more generally, in a metallization stack 140). In some embodiments, an inductor may be part of power circuitry (e.g., in a buck-boost converter or other circuitry to support different voltage domains across a die) or part of radio frequency (RF) circuitry (e.g., communications circuitry), for example.

The dummy structures 105 may include a dummy material 106. In some embodiments, the dummy material 106 may have a Young's modulus (also referred to as the "elastic modulus" or "modulus of elasticity") that is larger than the Young's modulus of the ILD 102. In such embodiments, the Young's modulus of the dummy material 106 may or may not be larger than the Young's modulus of the conductive structure 103. In some embodiments, a dummy material 106 that has a larger Young's modulus than the ILD 102 may be a dielectric material or a ferromagnetic material, such as any of the examples of dielectric dummy materials 106 or ferromagnetic dummy materials 106 discussed above, as suitable. When the dummy structures 105 have a higher Young's modulus than the ILD 102, dishing or other deformation during polishing may be mitigated. In some embodiments, a dummy material 106 that has a larger Young's modulus than the ILD 102 may be a dielectric material or a ferromagnetic material. Examples of dielectric dummy materials 106 may include silicon carbide, silicon nitride, aluminum oxide, or another suitable carbide, nitride, or oxide. Examples of ferromagnetic dummy materials 106 may include nickel, cobalt, or iron materials (e.g., materials in which particles of nickel, cobalt, or iron are included in a curable fluid that hardens to an appropriate Young's modulus). When the dummy structures 105 have a higher Young's modulus than the ILD 102, dishing or other deformation during polishing may be mitigated.

In some embodiments, the dummy material 106 may be a dielectric material that has a different material composition than the ILD 102. In such embodiments, the Young's modulus of the dummy material 106 may or may not be larger than the Young's modulus of the conductive structure 103. For example, the dummy material 106 may include silicon carbide, silicon nitride, aluminum oxide, or another suitable carbide, nitride, or oxide, different from the ILD 102. When the dummy structures 105 include a dielectric material, performance of the IC component 100 may improve relative to conventional IC components (e.g., due to reduction in undesirable eddy currents). For example, when the dummy structures 105 include a dielectric material, and the dummy structures 105 are included in the interior 111 of an inductor (e.g., as illustrated in FIG. 1B), performance of the inductor may be improved relative to inductors having conventional dummy structures therein.

In some embodiments, the dummy material 106 may have a Young's modulus that is larger than the Young's modulus of the conductive structure 103 (e.g., larger than the Young's modulus of the conductive fill material 104). For example, in embodiments in which the conductive fill material 104 is copper (with a Young's modulus of approximately 117 gigapascals), the dummy material 106 may have a Young's modulus larger than 117 gigapascals.

In some embodiments, the dummy material 106 may be a ferromagnetic material. In such embodiments, the Young's modulus of the dummy material 106 may or may not be larger than the Young's modulus of the conductive structure 103. Examples of ferromagnetic dummy materials 106 may include nickel, cobalt, or iron materials (e.g., materials in which particles of nickel, cobalt, or iron are included in a curable fluid). In some embodiments, ferromagnetic dummy materials 106 may be deposited by physical vapor deposition or chemical vapor deposition. Embodiments in which the dummy material 106 is a ferromagnetic material may be particularly desirable when the conductive structures 103 are part of an inductor, and the dummy structures 105 in the interior 111 of the inductor can serve as a magnetic core of the inductor. For example, in the embodiment of FIG. 1B, ferromagnetic dummy structures 105 may increase the inductance of the inductor relative to embodiments in which the dummy structures 105 are not ferromagnetic.

Although not shown in the accompanying drawings, in some embodiments, a liner material may be disposed between the dummy material 106 and the ILD 102. For example, when the dummy material 106 is a ferromagnetic material, a liner material between the dummy material 106 and the ILD 102 may be useful (e.g., as an adhesion liner or migration barrier, as discussed above).

The dimensions of the features of the IC component 100 of FIG. 1 may take any suitable values. For example, in some embodiments, the width 110 of the conductive structures 103 may be greater than 1 micron (e.g., between 1 micron and 10 microns, between 1 micron and 5 microns, or between 2 microns and 4 microns). In some embodiments, the width 112 of the dummy structures 105 may be greater than the width 110 of the conductive structures 103 by a factor greater than or equal to 1.5 (e.g., by a factor of 2, or by a factor between 2 and 5). In some embodiments, the aspect ratio of the conductive structures 103 (the ratio of the width 110 to the thickness 114) may be between 1:1 and 1:5 (e.g., between 1:1 and 1:3). In some embodiments, the thickness 115 of the dummy structures 105 may be between 1 micron and 20 microns. In some embodiments, the thickness 115 of the dummy structures 105 may be equal to the thickness 114 of the conductive structures 103. More generally, in some embodiments, the thickness 115 of the dummy structures 105 may be equal to the thickness 114 of the coplanar conductive lines included in the dummy structures 105 (e.g., as discussed below with reference to FIG. 3). In some embodiments, the x-side length 120 and/or the y-side length 116 of the conductive structure 103 (e.g., an inductor) may be between 100 microns and 500 microns.

In some embodiments in which the dummy structures 105 are arranged in an array 113 in an interior 111 of an inductor (e.g., as illustrated in FIG. 1B), the array 113 may be evenly spaced from the segments 103-1, 103-2, 103-3 and 103-4. In particular, the y-spacing 118-1 between the array 113 and the segment 103-1 may be equal to the y-spacing 118-2 between the array 113 and the opposing segment 103-3. Similarly, the x-spacing 122-1 between the array 113 and the segment 103-4 may be equal to the x-spacing 122-2 between the array 113 and the opposing segment 103-2. Such even spacing of the array 113 relative to the conductive structure 103 may be achieved, in some embodiments, by a manufacturing process in which the array 113 is patterned simultaneously with the conductive structure 103. An example of such a process as discussed below with reference to FIG. 2. When one patterning operation (e.g., using one lithographic mask) is used to pattern the conductive structure 103, and another patterning operation (e.g., using another lithographic mask) is used to pattern the array 113, it is difficult to achieve perfect alignment between the two different patterning operations, and thus an offset of the array 113 within the interior 111 would be expected. An even alignment of the array 113 within the interior 111 (e.g., the y-spacing 118-1 equals the y-spacing 118-2, and/or the x-spacing 122-1 equals the x-spacing 122-2) indicates the use of a simultaneous patterning (e.g., single-mask) technique.

The IC components 100 disclosed herein may be manufactured using any suitable techniques. In some embodiments, as noted above, one patterning operation (e.g., with one lithographic mask) may be performed to form the conductive structures 103, and another patterning operation (e.g., with another patterning mask) may be performed to form the dummy structures 105. In other embodiments, a single-mask technique may be used in which the conductive structures 103 and the dummy structures 105 are patterned simultaneously. As noted above, such single-mask techniques may advantageously reduce cost, reduce manufacturing time, and/or improve relative alignment of the patterned features. FIGS. 2A-2I illustrate stages in an example of such a process of manufacturing the IC component 100 of FIG. 1, in accordance with various embodiments.

Figure 2A:
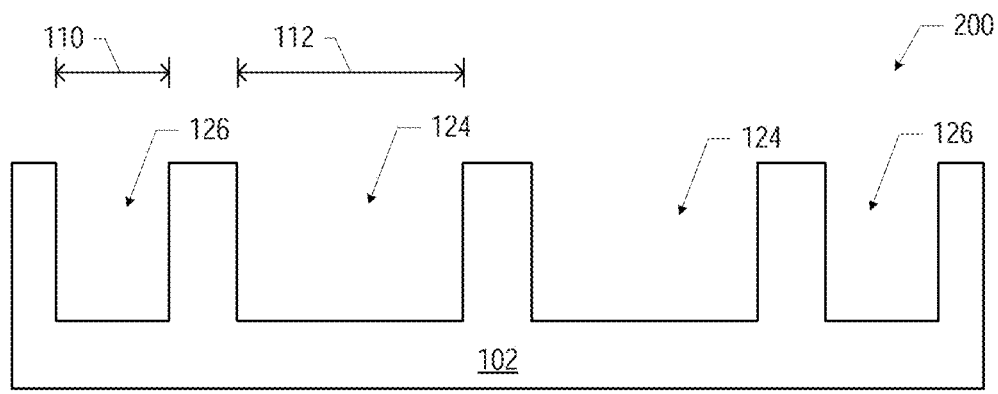
FIGS. 2A-2I illustrate stages in an example process of manufacturing the IC component of FIG. 1, in accordance with various embodiments.

FIG. 2A is a side cross-sectional view of an assembly 200 having conductive structure cavities 126 and dummy structure cavities 124 in an ILD 102. The conductive structure cavities 126 and the dummy structure cavities 124 may be patterned simultaneously using a single lithographic mask and subsequent etching operations. The width of the conductive structure cavities may be equal to the width 110 discussed above, and the width of the dummy structure cavities 124 may be equal to the width 112 discussed above.

Note that the width 112 of the dummy structure cavities 124 may be greater than the width 110 of the conductive structure cavities 126.

Figure 2B:
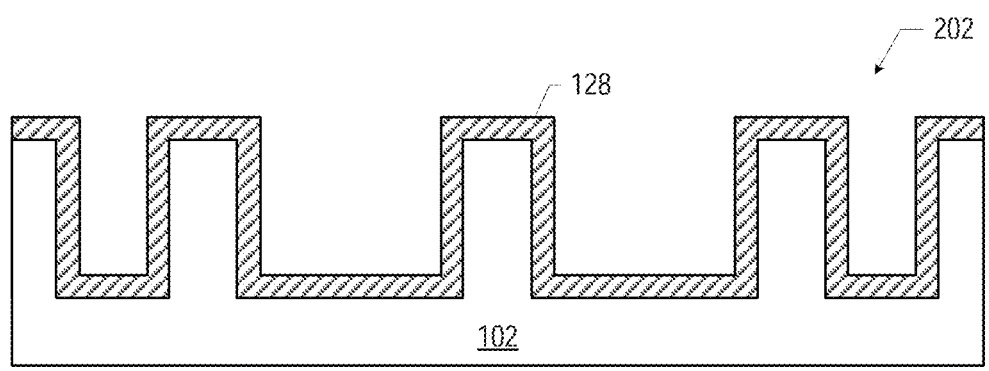

FIG. 2B is a side cross-sectional view of an assembly 202 subsequent to depositing a conformal layer of a sacrificial liner material 128 on the assembly 200 (FIG. 2A). The sacrificial liner material 128 may have a different material composition than the ILD 102 and may be deposited using any suitable technique (e.g., atomic layer deposition (ALD)). In some embodiments, the sacrificial liner material 128 may include titanium nitride or silicon oxide (e.g., when the ILD 102 includes silicon nitride or another material different from silicon oxide). In some embodiments, no sacrificial liner material 128 may be used, and thus the operations illustrated in FIG. 2B may be omitted.

Figure 2C:
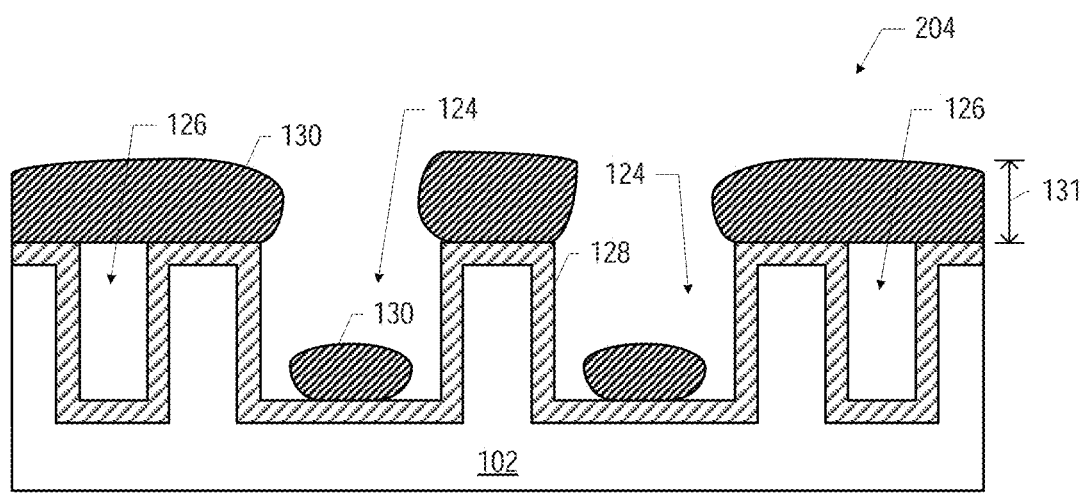

FIG. 2C is a side cross-sectional view of an assembly 204 subsequent to depositing a sacrificial blocking material 130 on the assembly 202 (FIG. 2B). The sacrificial blocking material 130 may have a different material composition than the ILD 102. The sacrificial blocking material 130 may be deposited using any suitable technique (e.g., physical vapor deposition (PVD) or chemical vapor deposition (CVD)) and may be deposited "thickly" so that the sacrificial blocking material covers the openings of the "narrower" conductive structure cavities 126 but does not fully cover the openings of the "wider" dummy structure cavities 124. Instead, the sacrificial blocking material 130 may include openings corresponding to the dummy structure cavities 124. In some embodiments, some of the sacrificial blocking material 130 may be deposited onto the bottoms of the dummy structure cavities 124, as shown. In some embodiments, the sacrificial blocking material 130 may include titanium nitride (e.g., deposited by PVD), amorphous silicon (e.g., deposited by PVD or CVD), silicon oxide (e.g., deposited by CVD and appropriate when the ILD 102 is not silicon oxide), or any other suitable material. In some embodiments, the thickness 131 of the sacrificial blocking material 130 may be greater than or equal to one half of the width 110.

Figure 2D:
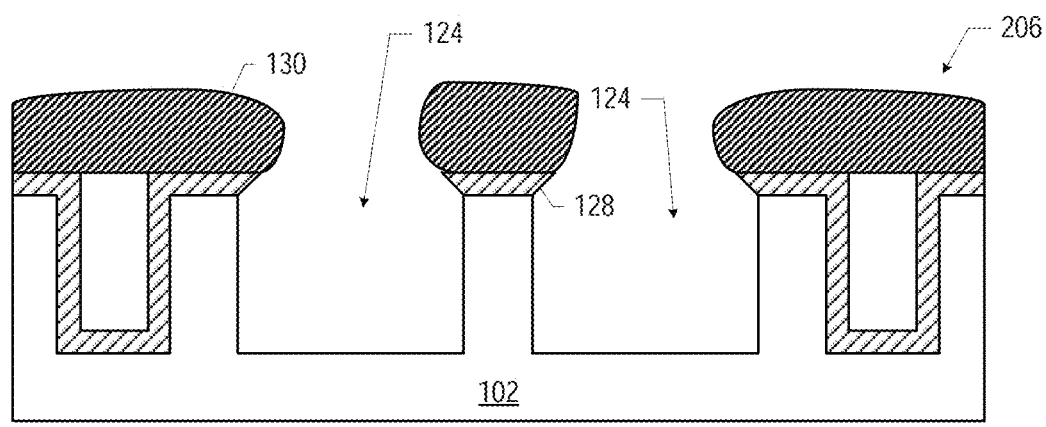

FIG. 2D is a side cross-sectional view of an assembly 206 subsequent to performing a wet etch or other cleaning procedure to remove the sacrificial blocking material 130 from the bottoms of the dummy structure cavities 124 of the assembly 204 (FIG. 2C). The wet etch may also remove the exposed sacrificial liner material 128 in the dummy structure cavities 124.

Figure 2E:
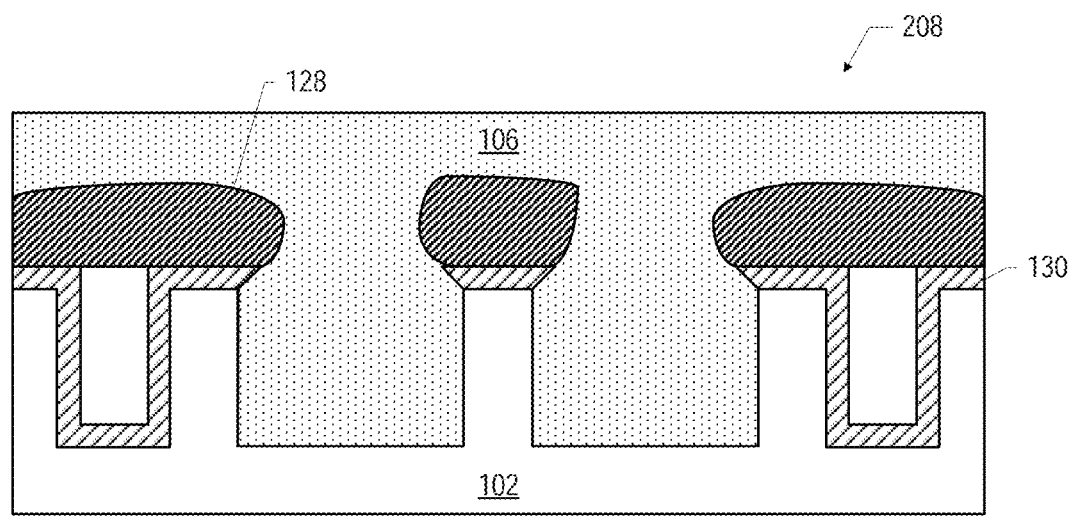

FIG. 2E is a side cross-sectional view of an assembly 208 subsequent to depositing the dummy material 106 on the assembly 206 (FIG. 2D). The dummy material 106 may take any of the forms disclosed herein. In some embodiments, the dummy material 106 may be a fillable or flowable material that can flow into the dummy structure cavities 124 even when the openings in the sacrificial blocking material 130 are fairly small; after flowing, the dummy material 106 may then be cured. For example, in some embodiments, the dummy material 106 may be silicon carbide that is spun on to the assembly 206. In some embodiments, the dummy material 106 may be deposited by PVD. For example, the dummy material 106 may be a ferroelectric metal deposited by PVD (e.g., to provide a magnetic core for an inductor, as discussed above). In some embodiments, the dummy material 106 may be deposited using ALD or CVD (e.g., when the openings in the sacrificial blocking material 130 are larger).

Figure 2F:
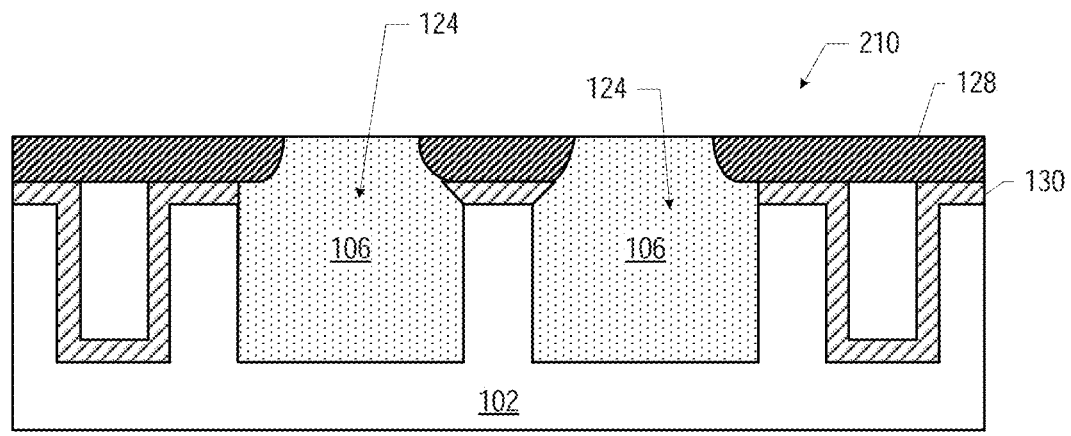

FIG. 2F is a side cross-sectional view of an assembly 210 subsequent to polishing the assembly 208 (FIG. 2E). The polishing of the assembly 208 may remove the overburden of the dummy material 106 and at least some of the sacrificial blocking material 130. Any suitable polishing technique may be used, such as a chemical mechanical planarization (CMP) technique.

Figure 2G:
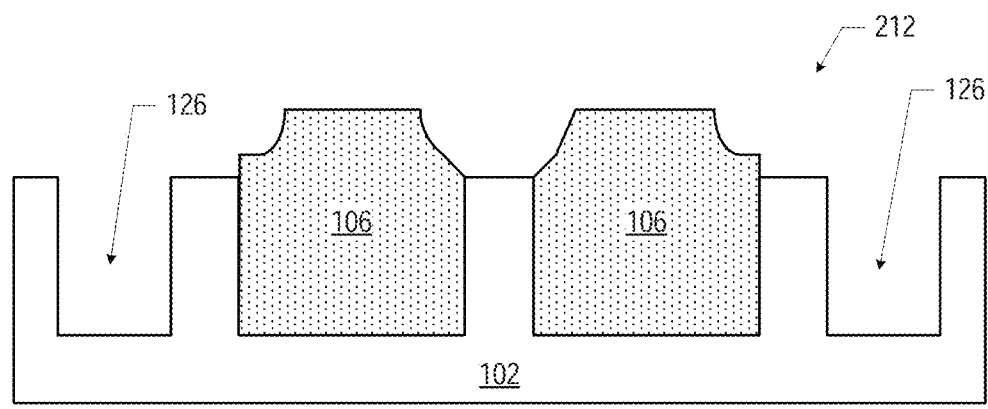

FIG. 2G is a side cross-sectional view of an assembly 212 subsequent to removing the sacrificial blocking material 130 and the sacrificial liner material 128 from the assembly 210 (FIG. 2F). Any suitable technique may be used to remove the sacrificial blocking material 130 and the sacrificial liner material 128, such as CMP and/or a wet clean. Upon removal of the sacrificial blocking material 130 and the sacrificial liner material 128, the conductive structure cavities 126 may be exposed.

Figure 2H:
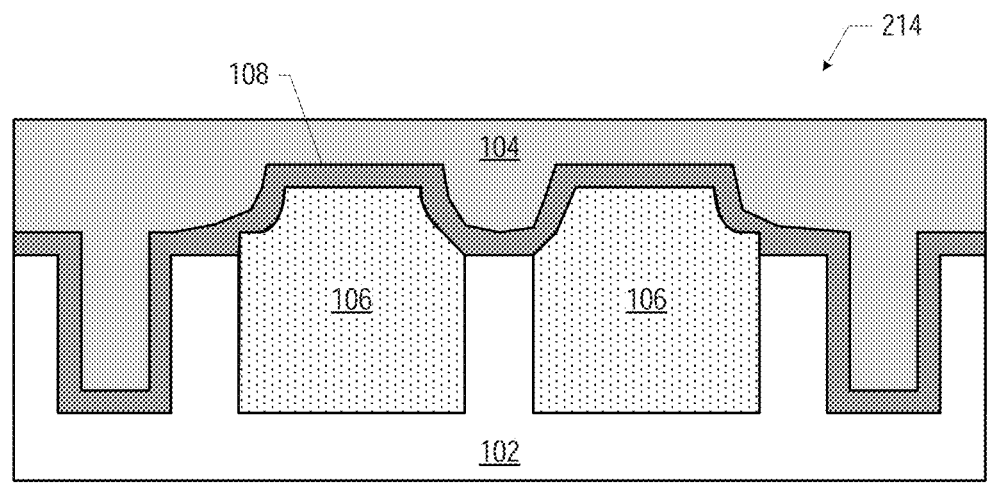

FIG. 2H is a side cross-sectional view of an assembly 214 subsequent to conformally depositing the liner material 108 (e.g., by ALD) and then depositing the conductive fill material 104 (e.g., by PVD or CVD), on the assembly 212 (FIG. 2G). The liner material 108 and the conductive fill material 104 may take any of the forms disclosed herein. In some embodiments, no liner material 108 may be used. As illustrated in FIG. 2H, the liner material 108 and the conductive fill material 104 may fill the conductive structure cavities 126.

Figure 2I:
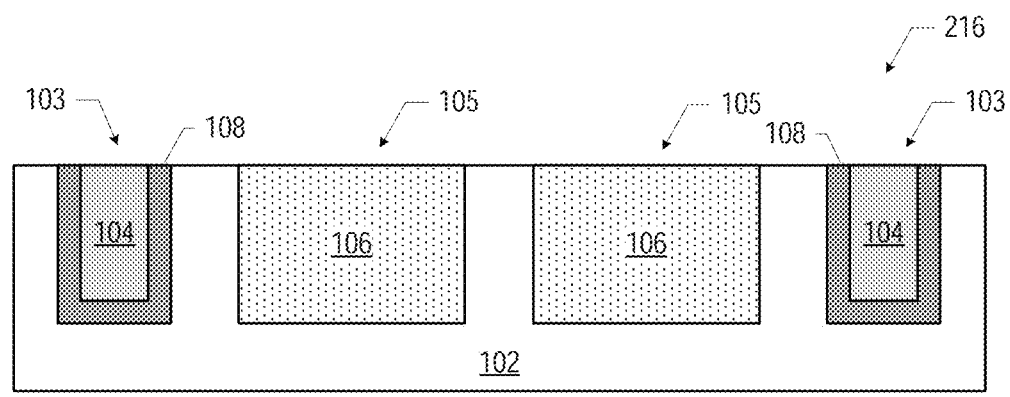

FIG. 2I is a side cross-sectional view of an assembly 216 subsequent to polishing the assembly 214 (FIG. 2H). The polishing of the assembly 214 may remove the overburden of the liner material 108 and the conductive fill material 104 (and in some embodiments, may remove some of the ILD 102 and the dummy material 106). Any suitable polishing technique may be used, such as a CMP technique. The assembly 216 may take the form of the IC component 100 of FIG. 1.

Although FIG. 1 illustrates an example of a conductive structure 103 that takes the form of a conductive line in an interconnect layer in a metallization stack 140, a conductive structure 103 may span multiple interconnect layers in a metallization stack 140. For example, FIG. 3 is a side cross-sectional view of an IC component 100 including conductive structures 103 that include conductive lines 136a and conductive vias 136b in an upper interconnect layer 134, as well as conductive lines 136a in a lower interconnect layer 132. In some embodiments, the conductive structure 103 of FIG. 3 may be an inductor, as discussed above with reference to FIG. 1; in other embodiments, the conductive structure 103 of FIG. 3 may not be an inductor. In some embodiments, the dummy structures 105 of FIG. 3 may be formed using the techniques discussed above with reference to FIG. 2.

Figure 4:
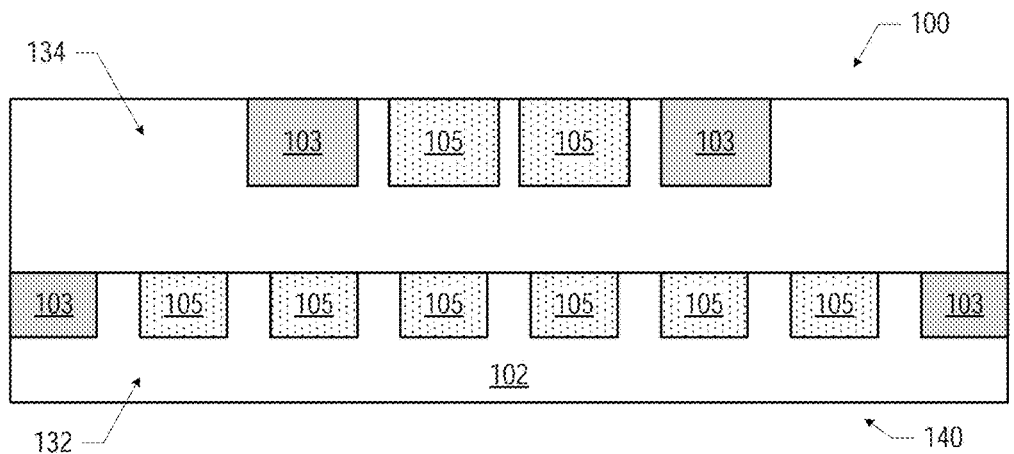

The dummy structures 105 disclosed herein may be used in multiple interconnect layers in a metallization stack 140. For example, FIG. 4 is a side cross-sectional view of an IC component 100 including a lower interconnect layer 132 and an upper interconnect layer 134. Dummy structures 105 and conductive structures 103 are present in the lower interconnect layer 132 and in the upper interconnect layer 134; details are omitted from FIG. 4 for clarity of illustration. In some embodiments, the conductive structures 103 in the upper interconnect layer 134 may be part of an inductor (e.g., as discussed above with reference to FIGS. 1 and 3), while the conductive structures 103 in the lower interconnect layer 132 may not be part of an inductor. The area "underneath" an inductor in a metallization stack 140 may experience strong electromagnetic fields and thus may not be a suitable location for sensitive electrical pathways in the metallization stack 140. Thus, as illustrated in FIG. 4, in some embodiments, dummy structures 105 may be positioned underneath the inductor in the lower interconnect layer 132, so that the potentially sensitive conductive structures 103 in the lower interconnect layer 132 may be amply spaced apart from the inductor in the upper interconnect layer 134. In some embodiments, the dummy structures 105 of FIG. 4 may be formed using the techniques discussed above with reference to FIG. 2 (e.g., repeated once for each of the interconnect layers 132 and 134).

Figure 5:
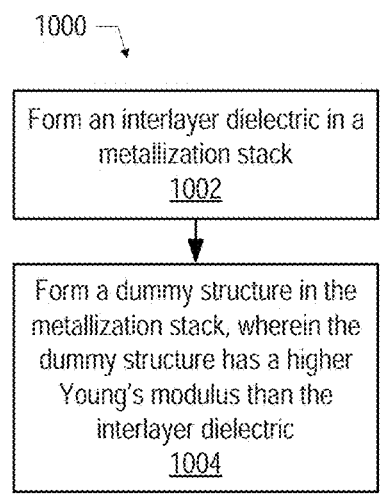
FIG. 5 is a flow diagram of a method of manufacturing an IC component including dummy structures, in accordance with various embodiments.

FIG. 5 is a flow diagram of a method 1000 of manufacturing an IC component, in accordance with various embodiments. Although the operations of the method 1000 may be illustrated with reference to particular embodiments of the IC components disclosed herein, the method 1000 may be used to form any suitable IC component. Operations are illustrated once each and in a particular order in FIG. 5, but the operations may be reordered and/or repeated as desired (e.g., with different operations performed in parallel when manufacturing multiple IC components simultaneously).

At 1002, an ILD may be formed in a metallization stack. For example, an ILD 102 may be deposited as part of a metallization stack 140 in accordance with any of the embodiments disclosed herein (e.g., as discussed above with reference to FIG. 2A).

At 1004, a dummy structure may be formed in the metallization stack. The dummy structure may have a higher Young's modulus than the ILD. For example, a dummy structure 105 may be formed in the metallization stack 140 with a dummy material 106 that has a higher Young's modulus than the ILD 102, in accordance with any of the embodiments disclosed herein (e.g., as discussed above with reference to FIGS. 2A-2I). In some embodiments, the dummy structure formed in the metallization stack may have a Young's modulus that is greater than a Young's modulus of the ILD, and greater than a Young's modulus of a conductive structure in the metallization stack (e.g., greater than a conductive fill material of the conductive structure).

The dummy structures 105 disclosed herein may be included in any suitable electronic component. FIGS. 6-10 illustrate various examples of apparatuses that may include any of the dummy structures 105 disclosed herein.

Figure 6:
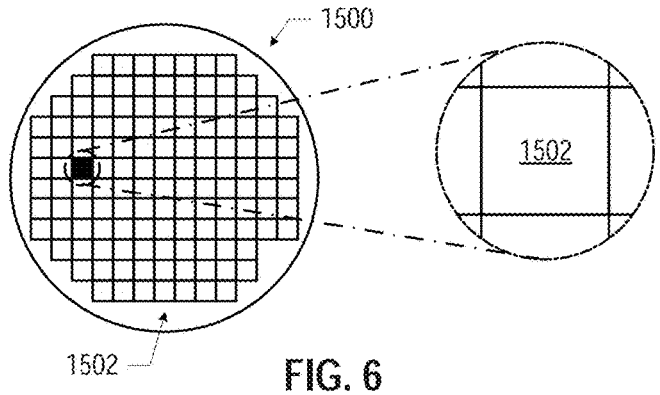
FIG. 6 is a top view of a wafer and dies that may include dummy structures, in accordance with any of the embodiments disclosed herein.

FIG. 6 is a top view of a wafer 1500 and dies 1502 that may include one or more dummy structures 105 or may be included in an IC package whose substrate includes one or more dummy structures 105 (e.g., as discussed below with reference to FIG. 8), in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more dummy structures 105 (e.g., as discussed below with reference to FIG. 7), one or more transistors (e.g., some of the transistors 1640 of FIG. 7, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 10) or other logic that is configured to store information in the memory devices or execute instructions stored in the memory array.

Figure 7:
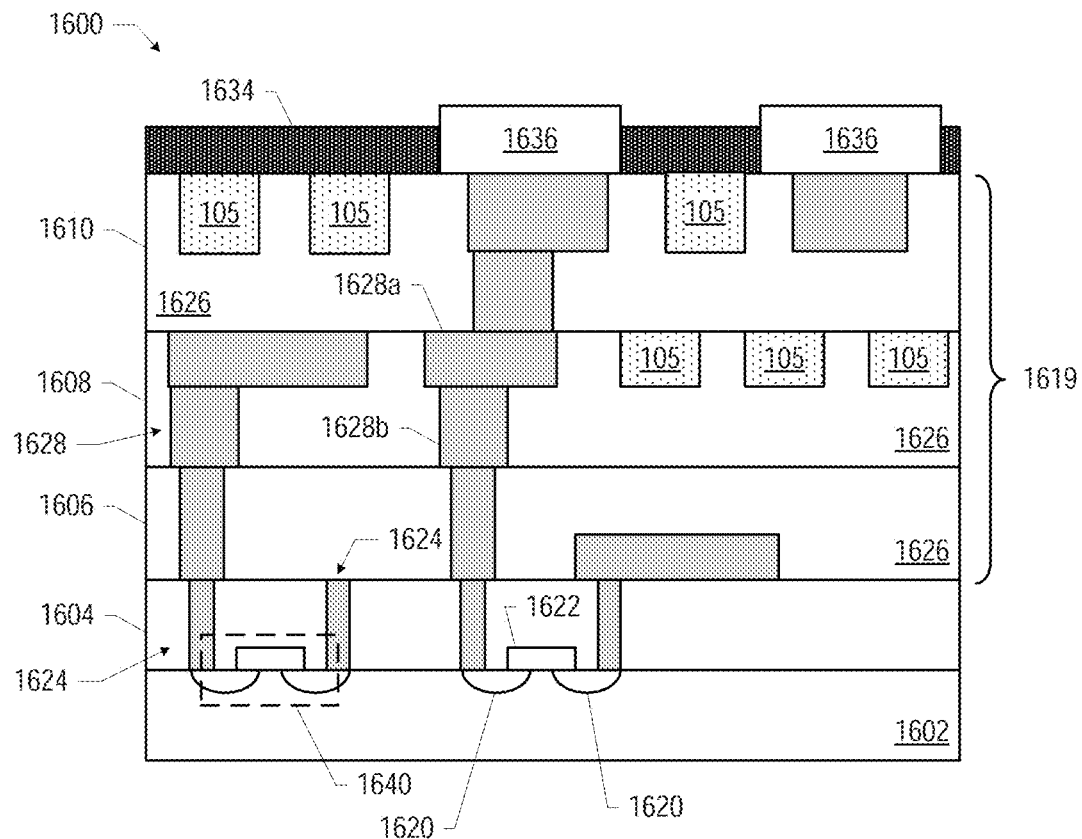
FIG. 7 is a cross-sectional side view of an IC device that may include dummy structures, in accordance with any of the embodiments disclosed herein.

FIG. 7 is a cross-sectional side view of an IC device 1600 that may include one or more dummy structures 105 or may be included in an IC package whose substrate includes one or more dummy structures 105 (e.g., as discussed below with reference to FIG. 8), in accordance with any of the embodiments disclosed herein. One or more of the IC devices 1600 may be included in one or more dies 1502 (FIG. 6). The IC device 1600 may be formed on a substrate 1602 (e.g., the wafer 1500 of FIG. 6) and may be included in a die (e.g., the die 1502 of FIG. 6). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 6) or a wafer (e.g., the wafer 1500 of FIG. 6).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 7 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 7 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600. The metallization stack 1619 of the IC device 1600 may be one embodiment of the metallization stack 140 discussed herein. In some embodiments, one or more dummy structures 105 may be disposed in one or more of the interconnect layers 1606-1610, in accordance with any of the techniques disclosed herein. FIG. 7 illustrates a particular number and arrangement of dummy structures 105 in the interconnect layers 1608 and 1610 for illustration purposes, but any number and arrangement of dummy structures 105 may be included in any one or more of the layers in a metallization stack 1619. In some embodiments, the IC device 1600 may not include any dummy structures 105. One or more conductive structures 103 (e.g., inductors) in the metallization stack 1619 may be coupled to any suitable ones of the devices in the device layer 1604 and/or to one or more of the conductive contacts 1636 (discussed below).

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 7. Although a particular number of interconnect layers 1606-1610 is depicted in FIG. 7, embodiments of the present disclosure include IC devices having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 7. The vias 1628*b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 7. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same. The dielectric material 1626 may be the ILD 102.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 7, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 8:
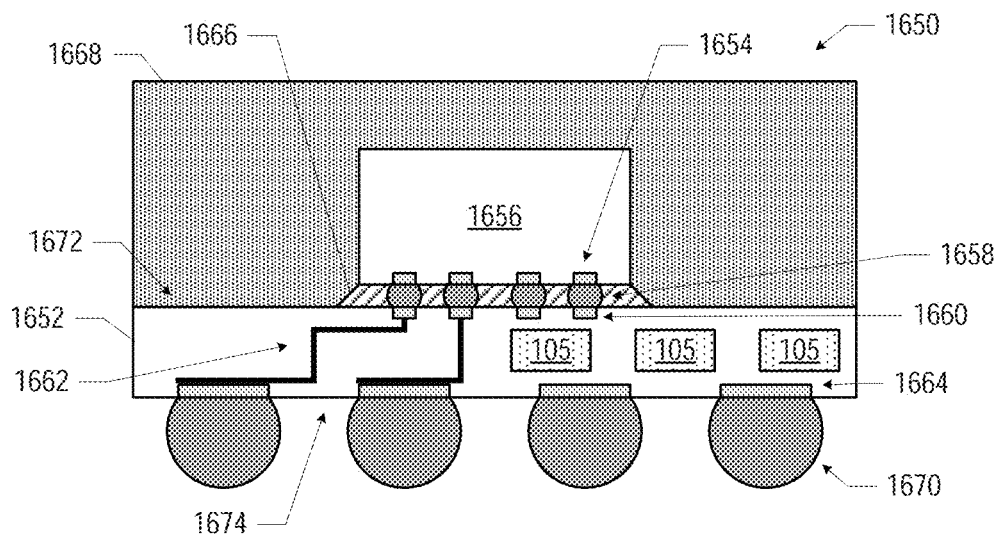
FIG. 8 is a cross-sectional side view of an IC package that may include dummy structures, in accordance with various embodiments.

FIG. 8 is a cross-sectional view of an example IC package 1650 that may include one or more dummy structures 105. The package substrate 1652 may be formed of a dielectric material and may have conductive pathways extending through the dielectric material between the face 1672 and the face 1674, between different locations on the 1672, and/or between different locations on the face 1674. These conductive pathways may take the form of any of the interconnect structures 1628 discussed above with reference to FIG. 7 (e.g., the package substrate 1652 may include a metallization stack, etc.). FIG. 8 illustrates a particular number and arrangement of dummy structures 105 in the package substrate 1652, but this number and arrangement of dummy structures 105 in the IC package 1650 is simply illustrative, and any number of dummy structures 105 may be included in a package substrate 1652. In some embodiments, no dummy structures 105 may be included in the package substrate 1652.

The IC package 1650 may include a die 1656 coupled to the package substrate 1652 via conductive contacts 1654 of the die 1656, first-level interconnects 1658, and conductive contacts 1660 of the package substrate 1652. The conductive contacts 1660 may be coupled to conductive pathways 1662 through the package substrate 1652, allowing circuitry within the die 1656 to electrically couple to various ones of the conductive contacts 1664 (or to other devices included in the package substrate 1652, not shown). The first-level interconnects 1658 illustrated in FIG. 8 are solder bumps, but any suitable first-level interconnects 1658 may be used. As used herein, a "conductive contact" may refer to a portion of conductive material (e.g., metal) serving as an electrical interface between different components; conductive contacts may be recessed in, flush with, or extending away from a surface of a component and may take any suitable form (e.g., a conductive pad or socket).

In some embodiments, an underfill material 1666 may be disposed between the die 1656 and the package substrate 1652 around the first-level interconnects 1658, and a mold compound 1668 may be disposed around the die 1656 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 8 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 9.

In FIG. 8, the IC package 1650 is a flip chip package and includes dummy structures 105 in the package substrate 1652. The die 1656 may take the form of any of the embodiments of the die 1502 discussed herein (e.g., may include any of the embodiments of the IC device 1600). In some embodiments, the die 1656 may include one or more dummy structures 105 (e.g., as discussed above with reference to FIG. 6 and FIG. 7); in other embodiments, the die 1656 may not include any dummy structures 105.

Although the IC package 1650 illustrated in FIG. 8 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although a single die 1656 is illustrated in the IC package 1650 of FIG. 8, an IC package 1650 may include multiple dies 1656. An IC package 1650 may include additional passive components, such as surface-mount resistors, capacitors, and inductors disposed on the first face 1672 or the second face 1674 of the package substrate 1652. More generally, an IC package 1650 may include any other active or passive components known in the art.

Figure 9:
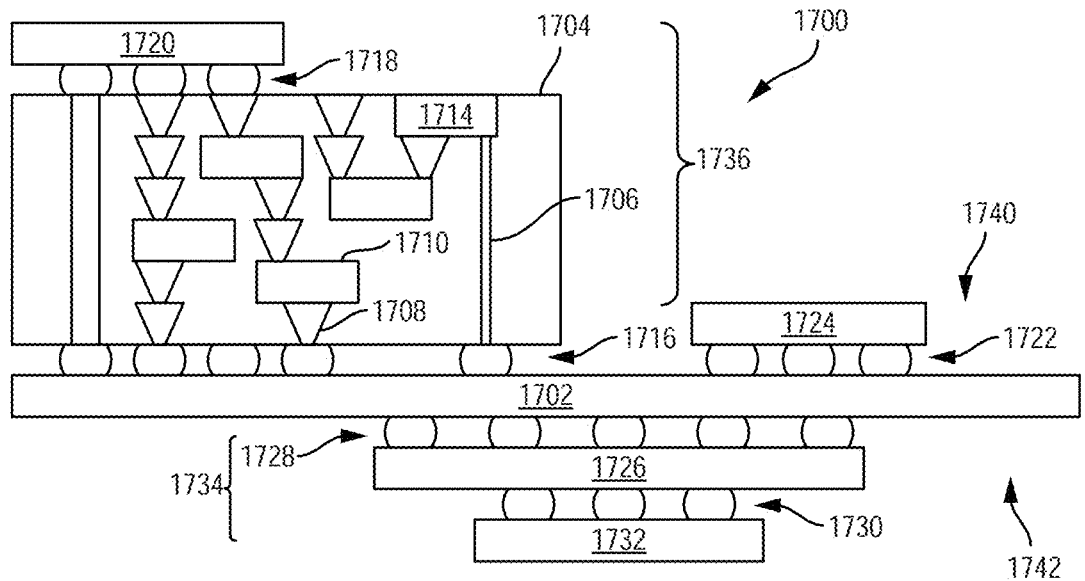
FIG. 9 is a cross-sectional side view of an IC device assembly that may include dummy structures, in accordance with any of the embodiments disclosed herein.

FIG. 9 is a cross-sectional side view of an IC device assembly 1700 that may include one or more IC packages or other electronic components (e.g., a die) including one or more dummy structures 105, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 8 (e.g., may include one or more dummy structures 105 in a package substrate 1652 or in a die).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 9 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702 and may include solder balls (as shown in FIG. 9), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 9, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 6), an IC device (e.g., the IC device 1600 of FIG. 7), or any other suitable component. Generally, the interposer 1704 may spread a connection to a wider pitch or reroute a connection to a different connection. For example, the interposer 1704 may couple the IC package 1720 (e.g., a die) to a set of BGA conductive contacts of the coupling components 1716 for coupling to the circuit board 1702. In the embodiment illustrated in FIG. 9, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to through-silicon vias (TSVs) 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art. In some embodiments, the interposer 1704 may include one or more dummy structures 105 (e.g., in a metallization stack, as discussed above).

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 9 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 10:
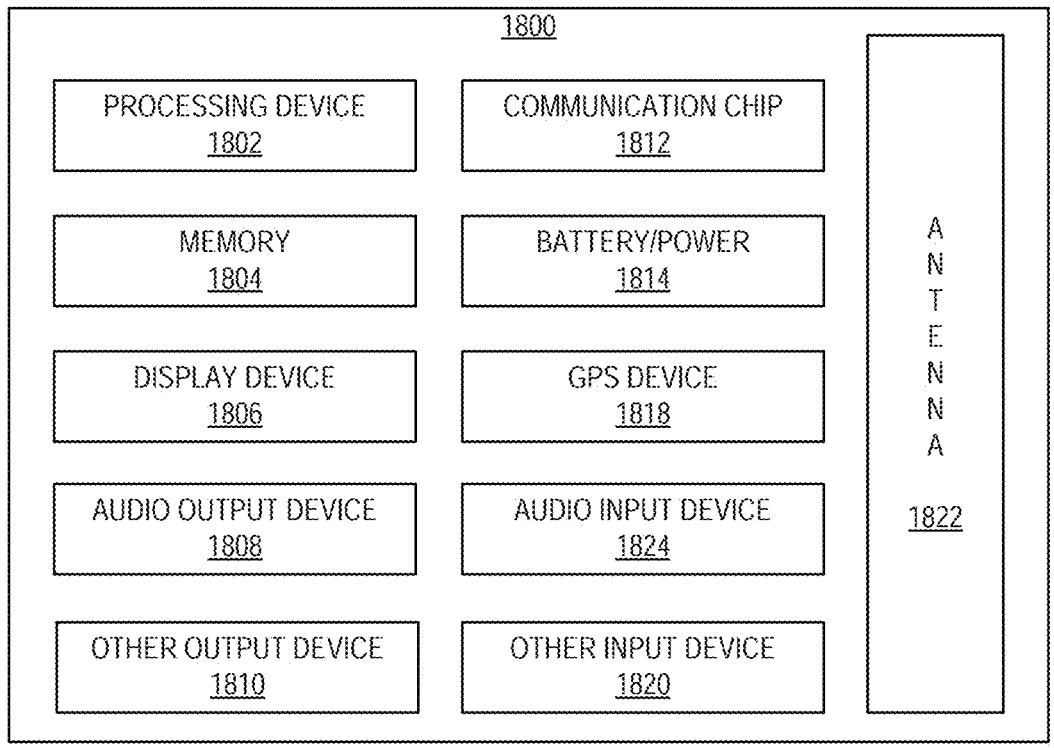
FIG. 10 is a block diagram of an example electrical device that may include dummy structures, in accordance with any of the embodiments disclosed herein.

FIG. 10 is a block diagram of an example electrical device 1800 that may include one or more dummy structures 105, in accordance with any of the embodiments disclosed herein. For example, any suitable ones of the components of the electrical device 1800 may include one or more of the IC packages 1650, IC devices 1600, or dies 1502 disclosed herein. A number of components are illustrated in FIG. 10 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 10, but the electrical device 1800 may include interface circuitry for coupling to the one or more components. For example, the electrical device 1800 may not include a display device 1806 but may include display device interface circuitry (e.g., a connector and driver circuitry) to which a display device 1806 may be coupled. In another set of examples, the electrical device 1800 may not include an audio input device 1824 or an audio output device 1808 but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) component, including: a metallization stack including an interlayer dielectric; and a dummy structure in the metallization stack, wherein the dummy structure includes a dummy material having a higher Young's modulus than the interlayer dielectric.

Example 2 may include the subject matter of Example 1, and may further specify that the metallization stack includes a conductive via or line, and the dummy material has a higher Young's modulus than the conductive via or line.

Example 3 may include the subject matter of any of Examples 1-2, and may further specify that the dummy material includes silicon carbide, silicon nitride, or aluminum oxide.

Example 4 may include the subject matter of any of Examples 1-3, and may further specify that the metallization stack includes an inductor.

Example 5 may include the subject matter of Example 4, and may further specify that the dummy structure is part of an array including a plurality of dummy structures in the metallization stack, and the array is in an interior of the inductor.

Example 6 may include the subject matter of Example 5, and may further specify that the array is spaced a first distance from a first segment of the inductor, the array is spaced a second distance from a second segment of the inductor, and the first distance and the second distance are equal.

Example 7 may include the subject matter of any of Examples 5-6, and may further specify that the inductor spans multiple interconnect layers in the metallization stack.

Example 8 may include the subject matter of any of Examples 1-7, and may further specify that the metallization stack includes a conductive line, and the dummy structure has a width that is greater than 1.5 times a width of the conductive line.

Example 9 may include the subject matter of any of Examples 1-8, and may further specify that the dummy material includes a ferromagnetic material.

Example 10 may include the subject matter of any of Examples 1-9, and may further specify that the dummy material includes nickel, cobalt, or iron.

Example 11 may include the subject matter of Example 10, and may further specify that the metallization stack includes a copper line or a copper via.

Example 12 may include the subject matter of any of Examples 1-11, and may further specify that the dummy structure is at least partially in a top interconnect layer in the metallization stack.

Example 13 may include the subject matter of any of Examples 1-12, and may further specify that the IC component is a die.

Example 14 is an integrated circuit (IC) component, including: a conductive structure in a metallization stack, wherein the conductive structure includes a conductive fill material; and a dummy structure in the metallization stack, wherein the dummy structure includes a dummy material having a higher Young's modulus than the conductive fill material.

Example 15 may include the subject matter of Example 14, and may further specify that the metallization stack includes an interlayer dielectric, and the dummy material includes a dielectric material different from the interlayer dielectric.

Example 16 may include the subject matter of any of Examples 14-15, and may further specify that the dummy material includes silicon carbide, silicon nitride, or aluminum oxide.

Example 17 may include the subject matter of any of Examples 14-16, and may further specify that the conductive structure is an inductor.

Example 18 may include the subject matter of Example 17, and may further specify that the dummy structure is part of an array including a plurality of dummy structures in the metallization stack, and the array is in an interior of the inductor.

Example 19 may include the subject matter of Example 18, and may further specify that the array is spaced a first distance from a first segment of the inductor, the array is spaced a second distance from a second segment of the inductor, and the first distance and the second distance are equal.

Example 20 may include the subject matter of any of Examples 14-19, and may further specify that the conductive structure spans multiple interconnect layers in the metallization stack.

Example 21 may include the subject matter of any of Examples 14-20, and may further specify that the dummy structure has a width that is greater than 1.5 times a width of the conductive structure.

Example 22 may include the subject matter of any of Examples 14-21, and may further specify that the conductive structure includes a conductive line.

Example 23 may include the subject matter of any of Examples 14-22, and may further specify that the dummy material includes a ferromagnetic material.

Example 24 may include the subject matter of any of Examples 14-23, and may further specify that the dummy material includes nickel, cobalt, or iron.

Example 25 may include the subject matter of any of Examples 14-24, and may further specify that the conductive structure includes copper.

Example 26 may include the subject matter of any of Examples 14-25, and may further specify that the conductive structure includes a liner material.

Example 27 may include the subject matter of any of Examples 14-26, and may further specify that the conductive structure is at least partially in a top interconnect layer in the metallization stack.

Example 28 may include the subject matter of any of Examples 14-27, and may further specify that the IC component is a die.

Example 29 is an integrated circuit (IC) component, including: an inductor in a metallization stack; and a dummy structure in an interior of the inductor, wherein the dummy structures includes a dielectric material.

Example 30 may include the subject matter of Example 29, and may further specify that the dummy structure is part of an array including a plurality of dummy structures in the metallization stack, and the array is in the interior of the inductor.

Example 31 may include the subject matter of Example 30, and may further specify that the array is spaced a first distance from a first segment of the inductor, the array is spaced a second distance from a second segment of the inductor, and the first distance and the second distance are equal.

Example 32 may include the subject matter of any of Examples 29-31, and may further specify that the inductor has a thickness including multiple conductive lines and at least one conductive via.

Example 33 is an integrated circuit (IC) component, including: an inductor in a metallization stack; and an array of dummy structures in an interior of the inductor, wherein the array is spaced a first distance from a first segment of the inductor, the array is spaced a second distance from a second segment of the inductor, and the first distance and the second distance are equal.

Example 34 may include the subject matter of Example 33, and may further specify that the second segment of the inductor is opposite from the first segment of the inductor.

Example 35 may include the subject matter of any of Examples 33-34, and may further specify that the dummy structures include a dielectric material.

Example 36 may include the subject matter of any of Examples 33-35, and may further specify that the dummy structures include a ferromagnetic material.

Example 37 may include the subject matter of any of Examples 33-36, and may further specify that the dummy structures include nickel, cobalt, or iron.

Example 38 may include the subject matter of any of Examples 33-37, and may further specify that the IC component is a package substrate or an interposer.

Example 39 is a method of manufacturing an integrated circuit (IC) component, including: forming an assembly including a conductive structure cavity and a dummy structure cavity in a dielectric material, wherein the dummy structure cavity is wider than the conductive structure cavity; depositing a sacrificial material on the assembly such that the sacrificial material covers an opening of the conductive structure cavity and does not cover an opening of the dummy structure cavity; removing sacrificial material at a bottom of the dummy structure cavity; after removing sacrificial material at the bottom of the dummy structure cavity, depositing a dummy material in the dummy structure cavity; removing the sacrificial material to expose the opening of the conductive structure cavity; and after removing the sacrificial material to expose the opening of the conductive structure cavity, depositing a conductive material in the conductive structure cavity.

Example 40 may include the subject matter of Example 39, and may further specify that depositing the sacrificial material on the assembly includes depositing the sacrificial material by physical vapor deposition or chemical vapor deposition.

Example 41 may include the subject matter of any of Examples 39-40, and may further specify that the sacrificial material includes titanium nitride, silicon, or silicon oxide.

Example 42 may include the subject matter of any of Examples 39-41, and may further include: before depositing the sacrificial material on the assembly, conformally depositing a sacrificial liner on the assembly; and removing the sacrificial liner before depositing the conductive material in the conductive structure cavity.

Example 43 may include the subject matter of any of Examples 39-42, and may further specify that the sacrificial material includes titanium nitride or silicon oxide.

Example 44 may include the subject matter of any of Examples 39-43, and may further specify that removing the sacrificial material at the bottom of the dummy structure cavity includes wet etching the sacrificial material at the bottom of the dummy structure cavity.

Example 45 may include the subject matter of any of Examples 39-44, and may further specify that depositing the dummy material in the dummy structure cavity includes providing a flowable dielectric material in the dummy structure cavity.

Example 46 may include the subject matter of any of Examples 39-45, and may further specify that the dummy material includes a ferromagnetic material.

Example 47 may include the subject matter of Example 46, and may further specify that the ferromagnetic material is deposited by physical vapor deposition.

Example 48 may include the subject matter of any of Examples 39-47, and may further specify that removing the sacrificial material to expose the opening of the conductive structure cavity includes performing a chemical mechanical planarization operation.

Example 49 may include the subject matter of any of Examples 39-48, and may further specify that removing the sacrificial material to expose the opening of the conductive structure cavity includes wet etching the sacrificial material.

Example 50 may include the subject matter of any of Examples 39-49, and may further specify that depositing a conductive material in the conductive structure cavity includes conformally depositing a liner material in the conductive structure cavity.

Example 51 is a computing device, including: a circuit board; and an integrated circuit (IC) component, coupled to the circuit board, wherein the IC component includes a metallization stack including an interlayer dielectric, and a dummy structure in the metallization stack, wherein the dummy structure includes a dummy material having a higher Young's modulus than the interlayer dielectric.

Example 52 may include the subject matter of Example 51, and may further specify that the IC component is a die, a package substrate, or an interposer.

Example 53 may include the subject matter of any of Examples 51-52, and may further include an antenna.

Example 54 may include the subject matter of any of Examples 51-53, and may further specify that the IC component includes radio frequency (RF) circuitry.

Example 55 may include the subject matter of any of Examples 51-54, and may further specify that the IC component includes power circuitry.

Example 56 may include the subject matter of any of Examples 51-55, and may further specify that the computing device is a server, hand-held computing device, or wearable computing device.

Example 57 may include the subject matter of any of Examples 51-56, and may further specify that the dummy material includes a dielectric material or a ferromagnetic material.

The invention claimed is:

1. An integrated circuit (IC) component, comprising:
a metallization stack including an interlayer dielectric and a conductive line or via; and
a dummy structure in the metallization stack, wherein the dummy structure includes a dummy material, wherein the dummy material has a higher Young's modulus than the interlayer dielectric and the dummy material has a higher Young's modulus than the conductive line or via.

2. The IC component of claim 1, wherein the dummy material includes silicon carbide, silicon nitride, or aluminum oxide.

3. The IC component of claim 1, wherein the metallization stack includes an inductor.

4. The IC component of claim 1, wherein the metallization stack includes a conductive line, and the dummy structure has a width that is greater than 1.5 times a width of the conductive line.

5. The IC component of claim 1, wherein the dummy material includes a ferromagnetic material.

6. The IC component of claim 5, wherein the metallization stack includes a copper line or a copper via.

7. The IC component of claim 1, wherein the dummy structure is at least partially in a top interconnect layer in the metallization stack.

8. The IC component of claim 1, wherein the IC component is a die.

9. An integrated circuit (IC) component, comprising:
an inductor in a metallization stack; and
a dummy structure in an interior of the inductor, wherein the dummy structure includes a dummy material; wherein the dummy material has a higher Young's modulus than an interlayer dielectric of the metallization stack.

10. The IC component of claim 9, wherein the dummy structure is part of an array including a plurality of dummy structures in the metallization stack, and the array is in the interior of the inductor.

11. The IC component of claim 10, wherein the array is spaced a first distance from a first segment of the inductor, the array is spaced a second distance from a second segment of the inductor, and the first distance and the second distance are equal.

12. The IC component of claim 9, wherein the inductor has a thickness including multiple conductive lines and at least one conductive via.

13. A computing device, comprising:
a circuit board; and
an integrated circuit (IC) component, coupled to the circuit board, wherein the IC component includes:
a metallization stack including an interlayer dielectric and a conductive line or via, and
a dummy structure in the metallization stack, wherein the dummy structure includes a dummy material, wherein the dummy material has a higher Young's modulus than the interlayer dielectric and the dummy material has a higher Young's modulus than the conductive line or via.

14. The computing device of claim 13, wherein the IC component is a die, a package substrate, or an interposer.

15. The computing device of claim 13, wherein the IC component includes radio frequency (RF) circuitry.

16. The computing device of claim 13, wherein the IC component includes power circuitry.

17. The computing device of claim 13, wherein the computing device is a server, hand-held computing device, or wearable computing device.

* * * * *